(12) United States Patent
Choi et al.

(10) Patent No.: US 7,152,087 B2
(45) Date of Patent: Dec. 19, 2006

(54) FINITE IMPULSE RESPONSE FILTER

(75) Inventors: Jong In Choi, Anyang-si (KR); Sang Yeon Kim, Gunpo-si (KR); Dong Il Han, Seoul (KR)

(73) Assignee: LG Electronics Inc., Seoul (KR)

( * ) Notice: Subject to any disclaimer, the term of this patent is extended or adjusted under 35 U.S.C. 154(b) by 729 days.

(21) Appl. No.: 10/322,978

(22) Filed: Dec. 18, 2002

(65) Prior Publication Data

US 2003/0135528 A1    Jul. 17, 2003

(30) Foreign Application Priority Data

Dec. 18, 2001    (KR) .................... 10-2001-0080761

(51) Int. Cl.
*G06F 17/10*    (2006.01)

(52) U.S. Cl. ..................................... 708/319
(58) Field of Classification Search ................ 708/319
See application file for complete search history.

(56) References Cited

U.S. PATENT DOCUMENTS

| 5,297,069 A | * | 3/1994 | Asato et al. | ................ 708/319 |
| 5,500,811 A | * | 3/1996 | Corry | ........................ 708/319 |
| 5,966,314 A | * | 10/1999 | Lee | ............................ 708/319 |
| 6,553,398 B1 | * | 4/2003 | Capofreddi | ................ 708/319 |

* cited by examiner

*Primary Examiner*—D. H. Malzahn
(74) *Attorney, Agent, or Firm*—Lee, Hong, Degerman, Kang & Schmadeka

(57) ABSTRACT

A filter, in particular, a finite impulse response (FIR) filter having a variable data input and output rate is disclosed. The FIR filter includes a first-in first-out (FIFO) architectural buffer, an address generator for circularly generating respective addresses for FIFO of data items and providing the addresses to the buffer, a filter for performing filtering on data items having different rates, which are input from the buffer, and outputting one or more data, and a controller for controlling address generation of the address generator and controlling transfer paths of data items for filtering of the filter. It is possible to variably control the input and output rate of filtering data by the FIR filter.

15 Claims, 7 Drawing Sheets input data x(n)
input data x(n+1)

filtered output data y(n)
filtered output data y(n+1)

FINITE IMPULSE RESPONSE FILTER

This application claims the benefit of the Korean Application No. P 2001-80761 filed on Dec. 18, 2001, which is hereby incorporated by reference.

BACKGROUND OF THE INVENTION

1. Field of the Invention

The present invention relates to a filter, and more particularly, to a finite impulse response (hereinafter referred to as FIR) filter having a variable data input and output rate.

2. Background of the Related Art

Generally, in a FIR filter, filtering is performed when data to be filtered is located in the center of a filter. Adjacent data items are located at right and left sides of data to be filtered, which is located at the center. The adjacent data items are also used for filtering. That is, when data to be filtered is located at the center, a filtered result is outputted by multiplying data to be filtered and adjacent data items by predetermined weights (for example, coefficients) and summing up the results of the multiplications.

At that time, data inputted to the filter is multiplied by the applied weights, while repeating shifting operation. It is possible to obtain filtered result data as a result of applying the data to be filtered and the adjacent data to the respective weights when the data to be filtered is located at the center of the filter.

FIG. 1 is a block diagram of a common 9-tab FIR filter having a fixed single input and output, which shows an FIR filter of a single input and a single output.

As shown in FIG. 1, the FIR filter having a single input data produces one output data that is identical to the input after a predetermined delay by shifting.

There are some cases where a succeeding block, which receives the output data of the FIR filter as an input, requires one or two data at need. However, since the conventional filter as shown in FIG. 1 has the single input-output architecture, next input data must be further used besides the simultaneously required present data if the succeeding block requires two input simultaneously. Accordingly, the conventional filter has a disadvantage that generates a time delay for waiting for next input data.

The filter structure shown in FIG. 2 is a FIR filter that is obtained by improving the above problem of FIG. 1. The FIR filter as shown in FIG. 2 uses a shift register so that data is shifted by one tab for each clock. FIG. 2 shows an example of a 9-tap FIR filter having two input-outputs simultaneously, which receives two input data and obtains two filtered output data simultaneously.

In the case of FIG. 2, similarly, the succeeding block receiving output data of the FIR filter as an input may require one or two data at need. Also, the succeeding block may variably require one data and then, continuously require all of the two data items.

The structures shown in FIG. 1 and FIG. 2 may satisfy each case that the succeeding block requires one filtered pixel data or two filtered pixel data. However, the structure of FIG. 1 cannot satisfy the latter case, and the structure of FIG. 2 cannot satisfy the former case.

This is because the filtering should be performed with respect to both the adjacent data and the data to be filtered in accordance with its characteristic.

According to the characteristics of the FIR filter of FIG. 1 and FIG. 2, if one target data is inputted as shown in FIG. 3, the input data is located at the center of the filter after 5 (five) clocks are delayed if two target data are inputted as shown in FIG. 4, the input data is located at the center of the filter after 3 clocks are delayed.

A delay time for 5 clocks is required regardless of the input for one filter to use target data and adjacent data items for filtering and to obtain a filtering result through shifting of the data items as shown in FIG. 1.

Moreover, in case where only one filtering result data is required in a filter structure where two data items are inputted and outputted as shown in FIG. 2, two input data items are received. Therefore, a separate memory is required for storing the input data items.

As described above, the conventional FIR filter has the disadvantage that it cannot satisfy the variable demand since the input and output rates of the data are fixed.

SUMMARY OF THE INVENTION

Accordingly, the present invention is directed to a finite impulse response filter that substantially obviates one or more problems due to limitations and disadvantages of the related art.

An object of the present invention is to provide a finite impulse response filter capable of variably adjusting input and output rates of filtering data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a finite impulse response (FIR) filter comprises a first-in first-out (FIFO) architectural buffer, an address generator for circularly generating respective addresses for FIFO of data items and providing the addresses to the buffer, a filter for performing filtering on data items having different rates, which are input from the buffer, and outputting one or more data, and a controller for controlling address generation of the address generator and controlling transfer paths of data items for filtering of the filter.

Preferably, the FIR filter further comprises a first switching component located on one input path of the buffer and ON/OFF controlled by the controller, a second switching component located on one output path of the buffer and turned ON/OFF at the same timing as the first switching component by the control of the controller, and a third switching component located on one output path of the filter and ON/OFF controlled by the controller.

Preferably, the buffer comprises a plurality of registers, one or more input data items are sequentially stored in registers corresponding to a write address generated by the address generator, and one or more data items are output from registers corresponding to a read address generated by the address generator in the order where the data items are sequentially stored.

The buffer comprises a plurality of registers and a first data path where input data sequentially transfer the registers and a second data path where input data transfer while skipping the registers one by one are formed in the filter. A data path where the input data pass through only even registers and/or a data path where the input data pass through only odd registers are formed in the filter. Switching components, which are ON/OFF controlled by the controller, are further comprised on a skip path formed so that the input data skip one register.

Preferably, the controller generates an internal control signal for controlling the address generator and the filter from a filter control signal. The internal control signal is generated by combining a plurality of delay signals obtained by synchronizing a filter control signal indicating the number of input data items with a clock and sequentially delaying the filter control signal with each other. Accordingly, a transfer range of data items located in respective registers included in the filter is determined by combining at least one of a plurality of delay signal with each other. It is determined whether data items located in respective registers included in the filter sequentially transfer to next register or data items of respective register transfer by skipping the next register. The number of output data items of the filter is determined. The number of input data items to the filter and a time period where respective input data items are received are determined. Internal control signals for determining a range of a register to be used for an operation with predetermined weights (filter coefficients) among registers included in the filter are generated.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
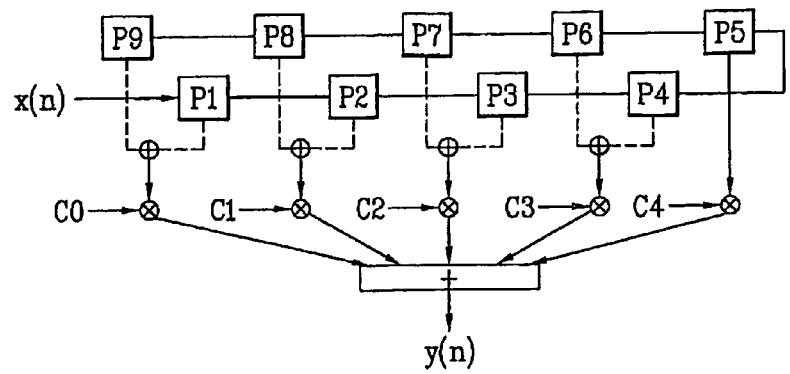
FIG. 1 illustrates a block diagram of a conventional nine-tab finite impulse response filter having a fixed single input and output.
Figure 2:
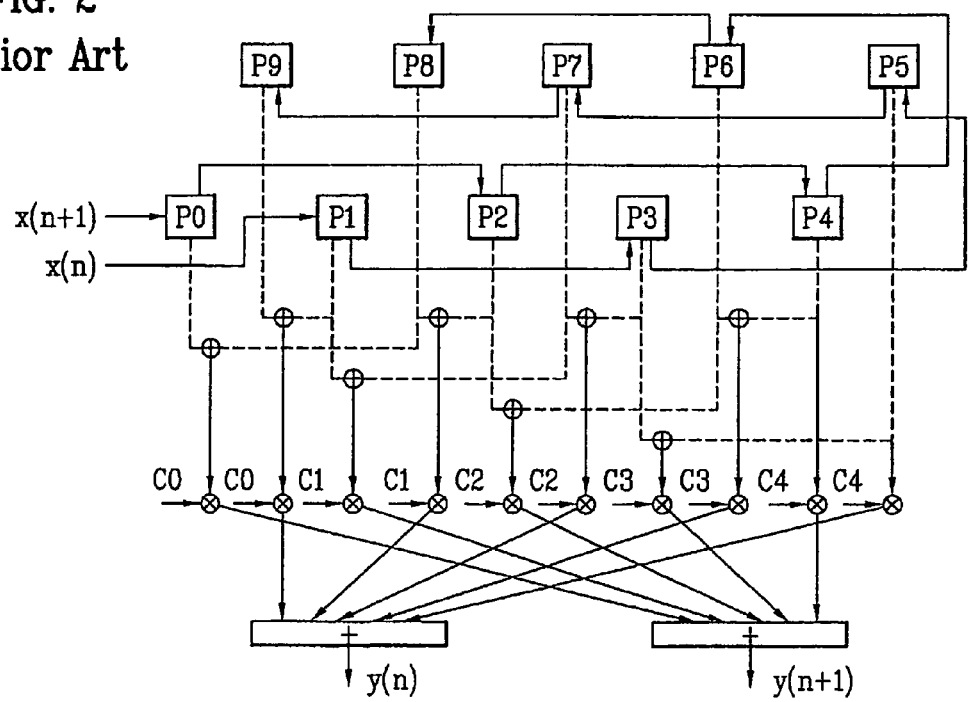
FIG. 2 illustrates a block diagram of a conventional nine-tab finite impulse response filter having a fixed dual input and output.
Figure 3:
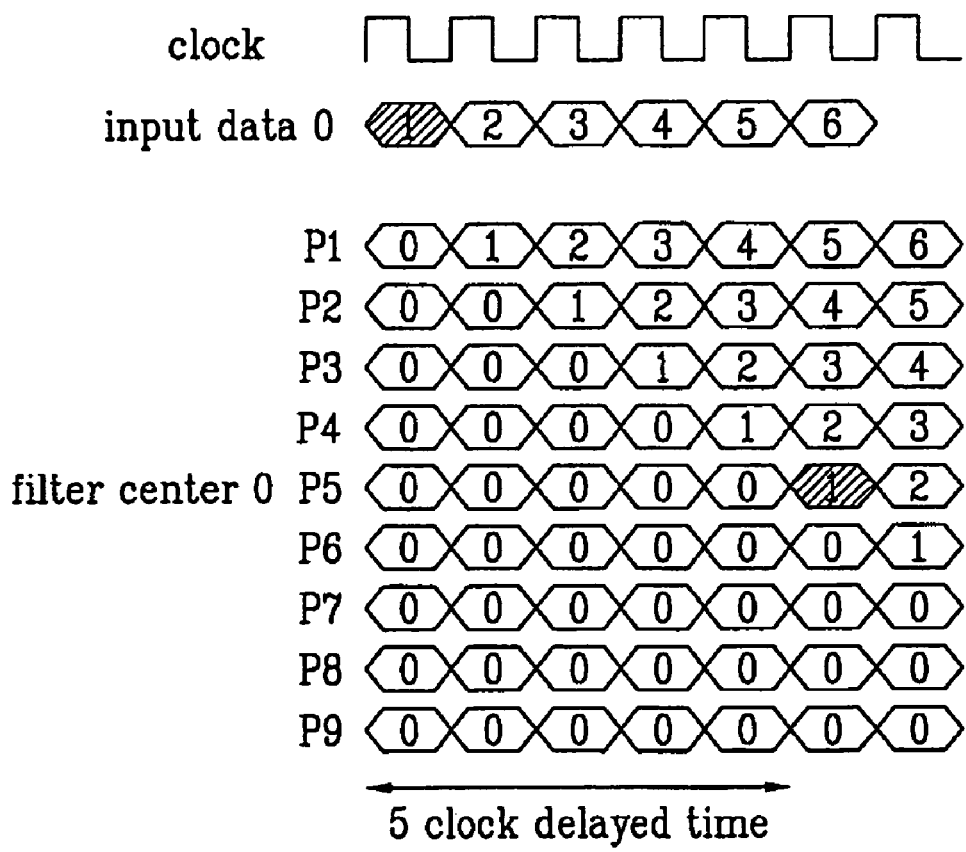
FIG. 3 illustrates a timing chart of the finite impulse response filter in FIG. 1.
Figure 4:
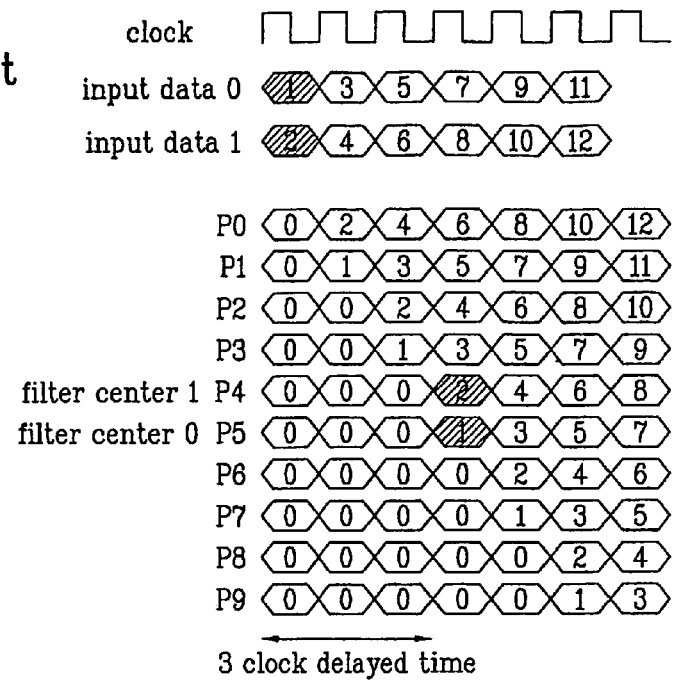
FIG. 4 illustrates a timing chart of the finite impulse response filter in FIG. 2.
Figure 5:
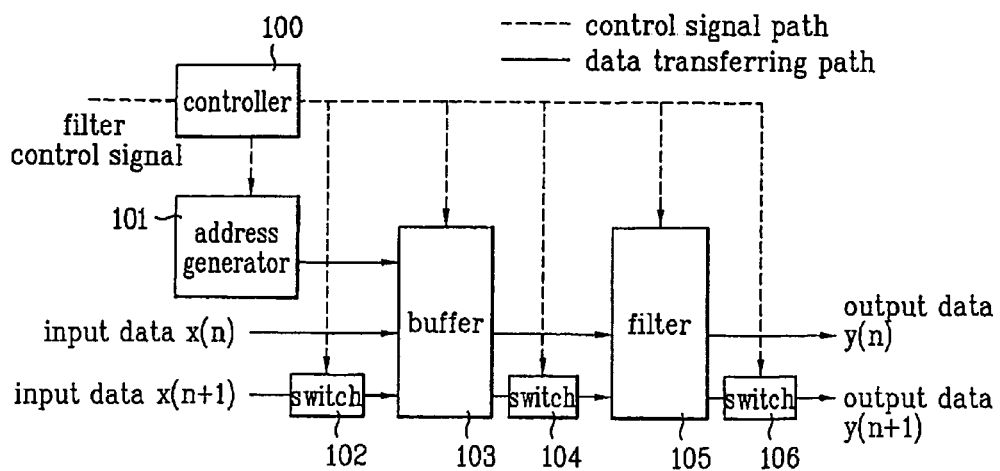
FIG. 5 illustrates a schematic block diagram of a finite impulse response filter having variable data rate characteristics according to the present invention.
Figure 6:
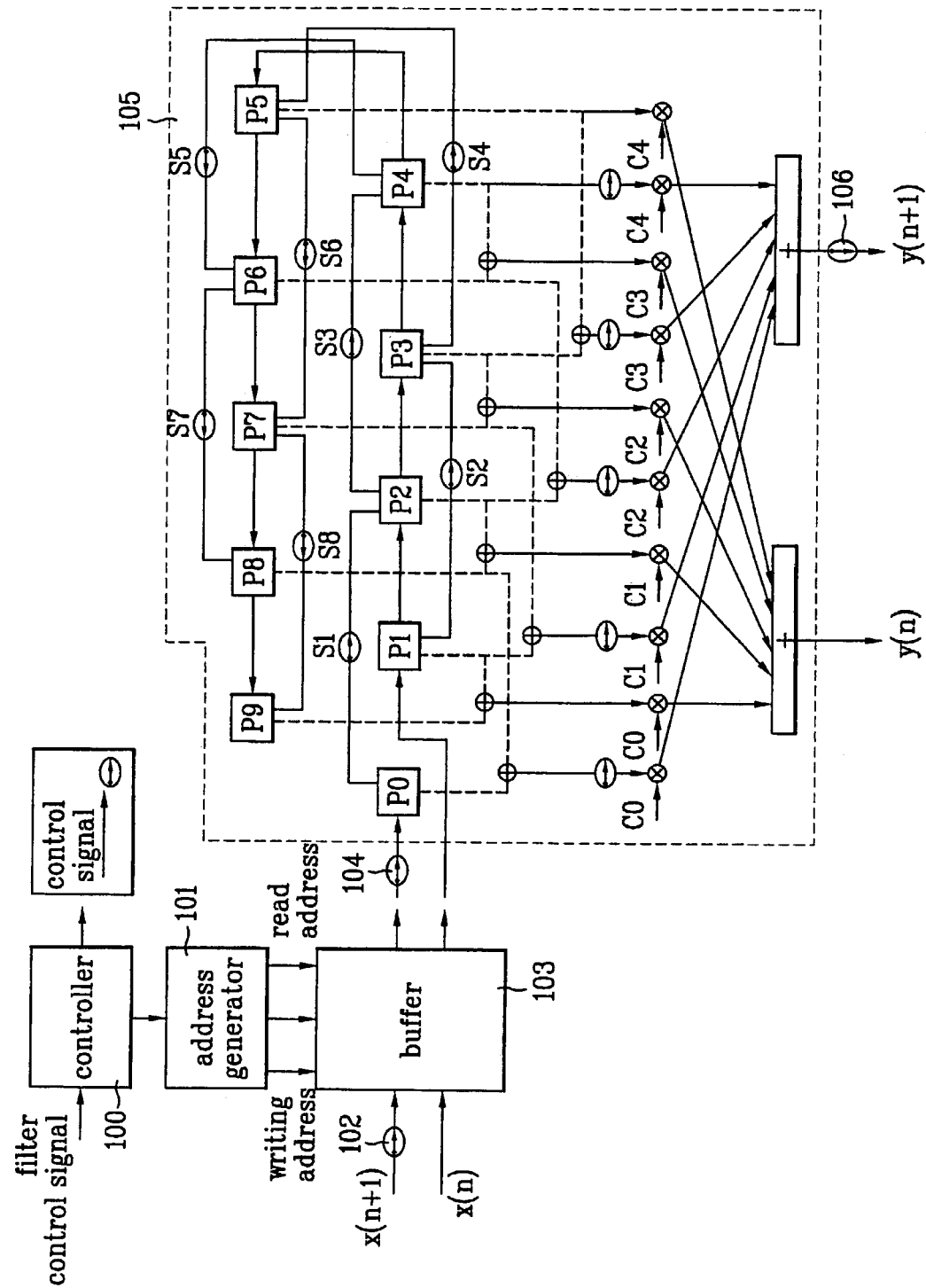
FIG. 6 illustrates a detail block diagram of the finite impulse response filter in FIG. 5.

FIG. 5 is a schematic block diagram of a finite impulse response filter according to the present invention, and FIG. 6 is a detail block diagram of the FIR filter according to the present invention.

As shown in FIG. 5 and FIG. 6, the FIR filter of the present invention includes a controller 100, an address generator 101, switching components 102, 104 and 106, a buffer 103, and a filter 105.

The controller 100 generates an internal control signal according to a filter control signal and controls the data transfer paths of the respective sections 101 to 106.

The buffer 103 has a first in first out (FIFO) structure. Therefore, the buffer 103 writes data in order according to control of the controller 100 and reads the data in the written order.

The address generator 101 generates a write address and a read address so that the buffer 103 can write and read data and outputs the write address and the read address to the buffer 103.

The filter 105 that includes a plurality of shift registers inside performs filtering for data items (single input data or a plurality of input data items) having different rates, which are inputted from the buffer 103 and outputs one or more data items.

The transfer paths of the data items located in the respective shift register of the filter 105 are controlled by the controller 100. That is, the data items located in the respective shift registers by the controller 100 are switched. The data items switched according to control of the transfer path by the controller 100 are multiplied by weights assigned to the respective registers (filter coefficients). The multiplication result values are added to each other and are outputted from the filter 105.

In the structure of the filter 105 shown in FIG. 6, 10 registers are used, however, a filtering operation is formed of 9-tab.

In the structure of the filter 105 of FIG. 6, there exists a first data path for sequentially transferring data from P1 register to P9 register. Also, a second data path where data passes through only even registers P0, P2, P4, P6, and P8 or odd registers P1, P3, P5, P7, and P9 exists. In the second data path, data starts to transfer from a P0 register and passes through the respective registers, skipping one by one, or data stars to transfer from the P1 register and passes through the respective registers, skipping one by one. In particular, a path of skipping one register as shown in FIG. 6 is a skip path described hereinafter.

In particular, switching components S1 to S8 turned ON and OFF by control of the controller 100 are included in the respective skip path in the second data path. The number of tabs of the filter 105 can vary according to how a filter is designed.

A first switching component 102 is located in one between the two input paths of the buffer 103. The first switching component 102 is turned ON and OFF according to the control signal of the controller 100. A switching component 104 is located in one between the two output paths (the two input paths of the filter 105) of the buffer 103. The second switching component 104 is turned ON and OFF according to the control signal of the controller 100.

The first switching component 102 and the second switching component 104 are turned ON and OFF at the same timing. When two data items of different rates are inputted to the filter 105 through the buffer 103, the first switching component 102 and the second switching component 104 are all turned on.

A third switching component 106 is located in one between the two output paths of the filter 105. The third switching component 106 is turned ON and OFF according to the control signal of the controlling unit 100. In particular, the third switching component 106 is turned ON when two data items of different rates are outputted from the filter 105.

Figure 7:
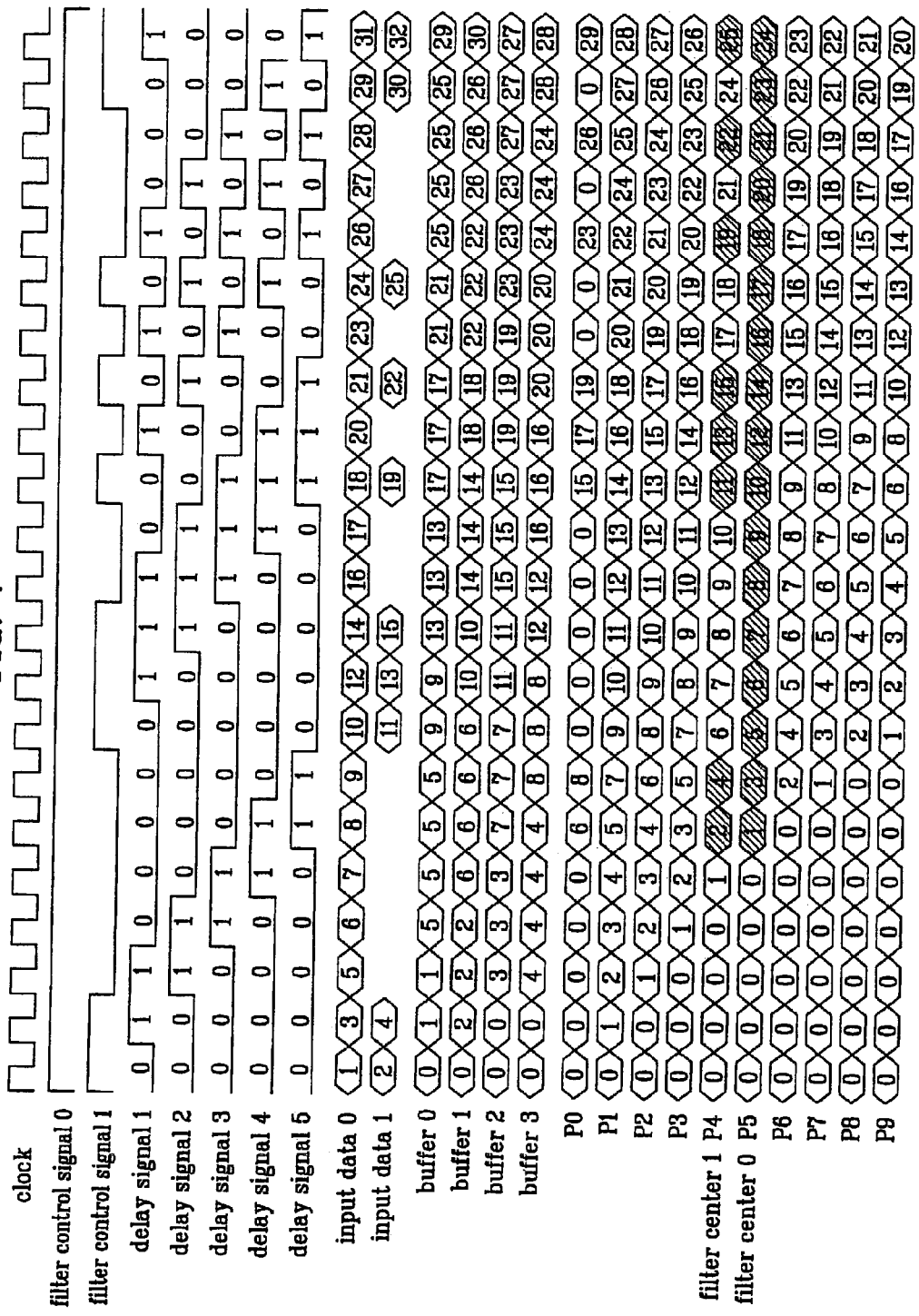
FIG. 7 illustrates a timing chart showing a buffer and an internal data stream of the filter in the finite impulse response filter according to the present invention.

FIG. 7 shows a timing chart for illustrating operation of the FIR filter according to the present invention, and illustrates operations of the buffer and the filter by the rules defined as follows.

A filter control signal 0 (zero) of FIG. 7 is a filter enable signal. A filter control signal 1 (one) indicates whether an input data is one or two. (When a value of the filter control signal 1 is 0, the number of input data is one, and when a value of the filter control signal 1 is 1, the number of input data is two.) Delay signals 1 to 5 are obtained by delaying the filter control signal 1 by one clock in the order. That is, a delay signal 1 (one) is a signal obtained by delaying the filter control signal by 1 (one) clock. A delay signal 2 is a signal obtained by delaying the filter control signal 1 by 2 (two) clocks. Rest delay signals 3, 4, and 5 are signals obtained by delaying by 3 (three) clocks, 4 (four) clocks, and 5 (five) clocks in order.

The controller 100 generates control signals necessary to apply the rules defined as follows by combining the delay signals 1, 2, 3, 4, and 5.

Rule 1)—The buffer 103 is composed of 4 (four) registers. The address generator 101 increases a write address and a read address so that the buffer 103 can input and output data and provides the write address and the read address to the buffer 103. In particular, the address generator 101 circularly generates address values from 0 to 3. For example, if the address value of 3 is provided as the last address value, the write address value of 0 or the read address value of 0 is provided to the buffer 103 in order to write one data in the buffer 103 or read one data from the buffer 103 at the next time period. Then, data is written to the register corresponding to the address value of 0 or the data of the register is read.

Also, for another example, in a state where the address value of 3 is provided as the last address value, in order to write two data in the buffer 103 at the next time period or to read two data items from the buffer 103, the write address value of 1 or the read address value of 1 is provided to the buffer 103. Then, two data items are written to the two registers corresponding to the address value of 1 or the two data items of the registers are read.

Rule 2)—If the value of the filter control signal 1, which means that input data is two, becomes '1' (one), two input data are written in the buffer 103 according to the writing address, and if the filter control signal 1, which means that input data is one, becomes '0' (zero), one input data is written in the buffer 103 according to the writing address. Moreover, finished the data writing in the buffer 103 according to the filter control signal 1, the writing address for the buffer 103 is increased by 2 (two) or 1 (one).

Rule 3)—It is determined whether to input some value to the P0 register and the P1 register of the filter 105 by the combination of the delay signals 1, 2, 3, and 4 at a specific time period. Moreover, in a case of reading the determined data buffer 103 and transferring the data read from the as the input value of the filter 105, the reading from 103 is finished and the reading address value for the is increased by two or one.

The above-described rule is illustrated as an example in Table 1.

TABLE 1

| Delay signal 5 | Delay signal 4 | Delay signal 3 | Delay signal 2 | Delay signal 1 | Filter register 0 | Filter register 1 |
|---|---|---|---|---|---|---|
| 0 | 0 | 0 | 0 | 0 | Not input | Input data 0 |
| 0 | 0 | 0 | 0 | 1 | Not input | Buffer data |
| 1 | 0 | 0 | 0 | 0 | Not input | Input data 0 |
| 1 | 0 | 0 | 0 | 1 | Not input | Buffer data |
| 0 | 1 | 0 | 0 | 0 | Input data 0 | Buffer data |
| 0 | 1 | 0 | 0 | 1 | Buffer data | Buffer data |
| 1 | 1 | 0 | 0 | 0 | Input data 0 | Buffer data |
| 1 | 1 | 0 | 0 | 1 | Buffer data | Buffer data |
| 0 | 0 | 1 | 0 | 0 | Not input | Buffer data |
| 0 | 0 | 1 | 0 | 1 | Not input | Buffer data |
| 1 | 0 | 1 | 0 | 0 | Not input | Buffer data |
| 1 | 0 | 1 | 0 | 1 | Not input | Buffer data |
| 0 | 1 | 1 | 0 | 0 | Buffer data | Buffer data |
| 0 | 1 | 1 | 0 | 1 | Buffer data | Buffer data |
| 1 | 1 | 1 | 0 | 0 | Buffer data | Buffer data |
| 1 | 1 | 1 | 0 | 1 | Buffer data | Buffer data |
| 0 | 0 | 0 | 1 | 0 | Not input | Buffer data |
| 0 | 0 | 0 | 1 | 1 | Not input | Buffer data |
| 1 | 0 | 0 | 1 | 0 | Not input | Buffer data |
| 1 | 0 | 0 | 1 | 1 | Not input | Buffer data |
| 0 | 1 | 0 | 1 | 0 | Buffer data | Buffer data |
| 0 | 1 | 0 | 1 | 1 | Buffer data | Buffer data |
| 1 | 1 | 0 | 1 | 0 | Buffer data | Buffer data |
| 1 | 1 | 0 | 1 | 1 | Buffer data | Buffer data |
| 0 | 0 | 1 | 1 | 0 | Not input | Buffer data |
| 0 | 0 | 1 | 1 | 1 | Not input | Buffer data |
| 1 | 0 | 1 | 1 | 0 | Not input | Buffer data |
| 1 | 0 | 1 | 1 | 1 | Not input | Buffer data |
| 0 | 1 | 1 | 1 | 0 | Buffer data | Buffer data |
| 0 | 1 | 1 | 1 | 1 | Buffer data | Buffer data |
| 1 | 1 | 1 | 1 | 0 | Buffer data | Buffer data |
| 1 | 1 | 1 | 1 | 1 | Buffer data | Buffer data |

Rule 4)—The transfer range of respective data located at respective registers of the filter 105 are determined by the combination of delay signals 2, 3, 4, and 5 at a specific time period. For example, if the delay signals 2, 3, 4, and 5 are 0001, data items located at the respective register are sequentially transferred to next register. Meanwhile, if the combination value of the delay signals 2, 3, 4, and 5 is 0001, the switching components S1 to S8 in the filter 105 are turned ON according to the control of the controller 100. When the switching components S1 to S8 are all turned on, respective data located at the respective registers are transferred to the next register by skipping the very next register and are transferred to the next register through a skip path where the respective switching components S1, S3, S5, S7, and S9 or S0, S2, S4, S6, and S8 are turned ON.

The above-described rule is illustrated as an example in Table 2.

TABLE 2

| Delay signal 2 | Delay signal 3 | Delay signal 4 | Delay signal 5 | Register shifting range of filter |
|---|---|---|---|---|
| 0 | 0 | 0 | 0 | 1 |
| 0 | 0 | 0 | 1 | 2 |
| 0 | 0 | 1 | 0 | 1 |
| 0 | 0 | 1 | 1 | 2 |
| 0 | 1 | 0 | 0 | 1 |
| 0 | 1 | 0 | 1 | 2 |
| 0 | 1 | 1 | 0 | 1 |
| 0 | 1 | 1 | 1 | 2 |
| 1 | 0 | 0 | 0 | 1 |
| 1 | 0 | 0 | 1 | 2 |
| 1 | 0 | 1 | 0 | 1 |
| 1 | 0 | 1 | 1 | 2 |
| 1 | 1 | 0 | 0 | 1 |
| 1 | 1 | 0 | 1 | 2 |
| 1 | 1 | 1 | 0 | 1 |
| 1 | 1 | 1 | 1 | 2 |

Rule 5)—The filter register range to be used for operation with the weights (filter coefficients) (C0, C1, C2, C3, and C4) for filtering is determined by the combination value of the delay signals 2, 3, 4, and 5 at a specific time period. The described rule 5) is illustrated as an example in Table 3.

TABLE 3

| Delay signal 2 | Delay signal 3 | Delay signal 4 | Delay signal 5 | Register used for filtering |
|---|---|---|---|---|
| 0 | 0 | 0 | 0 | P1~P9 |
| 0 | 0 | 0 | 1 | P1~P9 |
| 0 | 0 | 1 | 0 | P0~P9 |
| 0 | 0 | 1 | 1 | P0~P9 |
| 0 | 1 | 0 | 0 | P1~P9 |
| 0 | 1 | 0 | 1 | P1~P9 |
| 0 | 1 | 1 | 0 | P0~P9 |
| 0 | 1 | 1 | 1 | P0~P9 |
| 1 | 0 | 0 | 0 | P1~P9 |
| 1 | 0 | 0 | 1 | P1~P9 |
| 1 | 0 | 1 | 0 | P0~P9 |
| 1 | 0 | 1 | 1 | P0~P9 |
| 1 | 1 | 0 | 0 | P1~P9 |
| 1 | 1 | 0 | 1 | P1~P9 |
| 1 | 1 | 1 | 0 | P0~P9 |
| 1 | 1 | 1 | 1 | P0~P9 |

Rule 6)—The number of filtered data items outputted by controlling the third switching component 106 is determined according to the combination value of the delay signals 2, 3, 4, and 5 at a specific time period are determined. For example, if the combination value of the delay signals 2, 3, 4, and 5 is "0001", the third switching component 106 is turned OFF and one filtered data is output, that is, y(n). Meanwhile, if the combination value of the delay signals 2, 3, 4, and 5 is "0010", the third switching component 106 is turned ON and two filtered data items are output, that is, y(n) and y(n+1).

The above-described rule 6) is illustrated as an in table 4.

TABLE 4

| Delay signal 2 | Delay signal 3 | Delay signal 4 | Delay signal 5 | No of output data |
|---|---|---|---|---|
| 0 | 0 | 0 | 0 | 1 |
| 0 | 0 | 0 | 1 | 1 |
| 0 | 0 | 1 | 0 | 2 |
| 0 | 0 | 1 | 1 | 2 |
| 0 | 1 | 0 | 0 | 1 |
| 0 | 1 | 0 | 1 | 1 |
| 0 | 1 | 1 | 0 | 2 |
| 0 | 1 | 1 | 1 | 2 |
| 1 | 0 | 0 | 0 | 1 |
| 1 | 0 | 0 | 1 | 1 |
| 1 | 0 | 1 | 0 | 2 |
| 1 | 0 | 1 | 1 | 2 |
| 1 | 1 | 0 | 0 | 1 |
| 1 | 1 | 0 | 1 | 1 |
| 1 | 1 | 1 | 0 | 2 |
| 1 | 1 | 1 | 1 | 2 |

Figure 8:
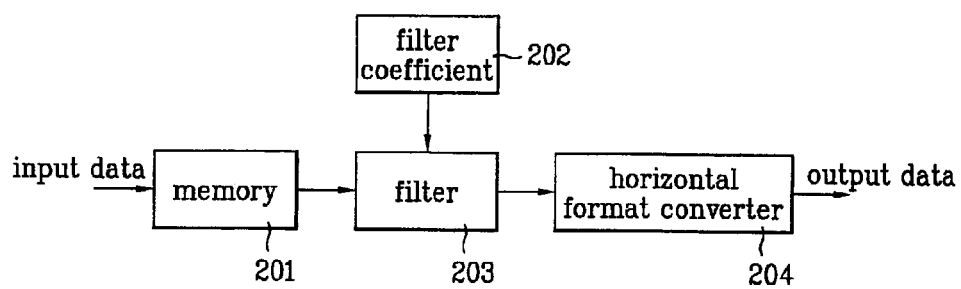
FIG. 8 illustrates a schematic block diagram showing an example of a horizontal format converter which the finite impulse response filter according to the present invention is applied.

FIG. 8 shows an example of applying a finite impulse response filter according to the present invention to a horizontal format converter. The horizontal format converter reduces the number of horizon pixels of an input image by means of the down-conversion or increases the number of horizon pixels of the input image by means of the up-conversion.

As illustrated in FIG. 8, the input data is inputted to a filter 203 with a structure suggested by the present invention after being temporary stored in the memory 201. The filter 203 receives a filter coefficient 202 and performs filtering under the procedure described in FIG. 6. As a result, one or two filtered data are outputted to the horizontal image format converter 204.

Input data are provided for preventing aliasing that may occur during the down-conversion, one of horizontal format conversions, so that the input data is first filtered through the FIR filter 203. The horizontal format converter 204 performs a format conversion by using the filtered data. By the above-described format conversions, an output image greater or smaller than the input image is produced. At that time, data consisting the output image is obtained by means of interpolation between one or more filtered data.

Figure 9:
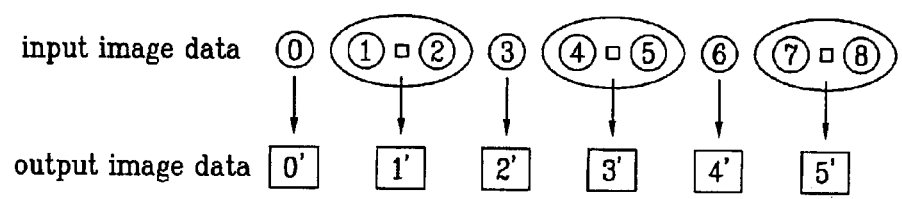
FIG. 9 illustrates a view showing an example of a simple down-conversion performed in the horizontal format converter in FIG. 8.
Figure 10:
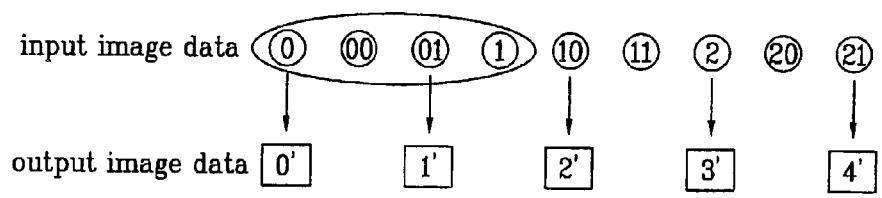
FIG. 10 illustrates a view showing an example of a simple up-conversion performed in the horizontal format converter in FIG. 8.

FIGS. 9 and 10 illustrate respective examples of the down-conversion and up-conversion performed in the horizontal format converter 204.

Figure 11:
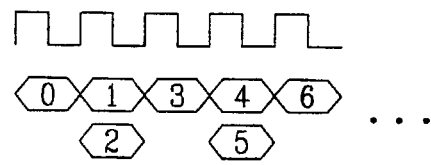
FIG. 11 illustrates a timing chart of an output data of a finite impulse response filter required during the down-conversation like FIG. 9.
Figure 12:
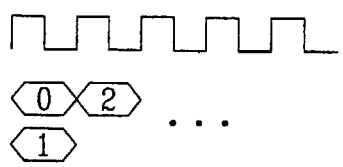
FIG. 12 illustrates a timing chart of an output data of a finite impulse response filter required during the up-conversation like FIG. 10.

FIGS. 11 and 12 illustrate timing charts of data required during the down-conversion and up-conversion shown in FIGS. 9 and 10.

For example, in the down-conversion of FIG. 9, in order to generate "1'" as output image data, input image data of Nos. 1 and 2 in FIG. 9 are required simultaneously. Accordingly, in the filter 203 according to the present invention, the data of Nos. 1 and 2 (a dotted part of FIG. 11) are simultaneously output through two terminals y(n) and y(n+1) of FIG. 6.

Moreover, in the up-conversion of FIG. 10, in order to generate "0' and 1'" as output image data, input image data of Nos. 0 and 1 in FIG. 10 are required simultaneously. Accordingly, in the filter 203 according to the present invention, the data (the dotted line part of FIG. 12) of Nos. 0 and 1 are simultaneously output through the two terminals y(n) and y(n+1) of FIG. 6.

Figure 13:
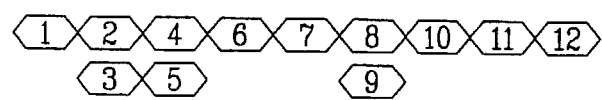
FIG. 13 shows a timing chart illustrating an example of filtered output data that filtered an input data at a data rate required by the horizontal format converter in FIG. 8.
Figure 13:
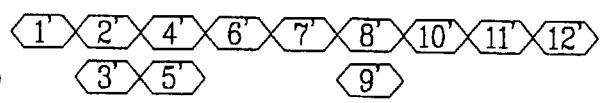

FIG. 13 is a timing chart illustrating an example for filtering and transferring an input data at a data rate required by the horizontal format converter in FIG. 8. FIG. 13 illustrates an example for a horizontal format converter inputting data at a desired data rate using the filtering structure according to the present invention and outputting data at a desired data rate.

At that time, the output data may be one or two even though the input data is two.

As described above, when the FIR filter according to the present invention is located at the front end of the horizontal format converter for converting the size of the input image in accordance with the output format as the digital TV application, it is possible to prevent aliasing that may occur during the image format conversion by filtering and to provide data required for the image format conversion at a necessary time period. Accordingly, the horizontal image format converter using the FIR filter according to the present invention can perform faster and better image format conversion.

As described above, according to the FIR filter of the present invention, the succeeding block, which receives the output data of the FIR filter as an input, demands one or two data at need. When the FIR filter of the present invention is used, it is possible to variably output one filtered data at a time period when one data is required and two filtered data at a time period when two data are required.

Moreover, although two data items can be input and output in the filter structure according to the present invention, it is possible to let data variably input by a switching component located at the input port of the filter in preparation for a case where only one filtering result data is required.

Also, it is possible to realize the conventional filters having different data rates into one filter according to the present invention. Therefore, the FIR filter of the present invention has an advantage of saving a large amount of hardware resources in a unit requiring a plenty of hardware resources.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A finite impulse response (FIR) filter comprising:
  a first-in first-out (FIFO) architectural buffer;
  an address generator for generating respective addresses for FIFO of data items and providing the addresses to the buffer;
  a filter for performing filtering on data items having different rates, which are output from the buffer, and outputting one or more data; and
  a controller for controlling address generation of the address generator and controlling filtering operation of the filter.

2. The FIR filter of claim 1, further comprising:
  a first switching component switching input to the buffer and being controlled by the controller;
  a second switching component switchina output from the buffer and turned ON/OFF at the same timing as the first switching component by the control of the controller; and
  a third switching component switching output from the filter and being controlled by the controller.

3. The FIR filter of claim 2, wherein the first and second switching components are turned ON according to a control signal of the controller when data items having different rates are input to the filter through the buffer.

4. The FIR filter of claim 2, wherein the third switching component is turned ON according to the control signal of the controller when data items having different rates are output from the filter.

5. The FIR filter of claim 1, wherein the buffer comprises a plurality of registers, and wherein one or more input data items are sequentially stored in registers corresponding to a write address generated by the address generator and one or more data items are output from registers corresponding to a read address generated by the address generator in the order that the data items are sequentially stored.

6. The FIR filter of claim 1, wherein the filter comprises a plurality of registers, and wherein the filter includes a first data path where input data are sequentially transferred to the registers and a second data path where input data are transferred every other register.

7. The FIR filter of claim 6, wherein a data path where the input data pass through only even registers and/or a data path where the input data pass through only odd registers are formed in the filter.

8. The FIR filter of claim 6, wherein switching components ON/OFF controlled by the controller are further comprised on a skip path formed so that the input data skip every other register.

9. The FIR filter of claim 1, wherein the controller generates an internal control signal for controlling the address generator and the filter from an filter control signal.

10. The FIR filter of claim 9, wherein the internal control signal is generated by combining a plurality of delay signals obtained by synchronizing an filter control signal indicating the number of input data items with a clock and sequentially delaying the filter control signal with each other.

11. The FIR filter of claim 1, wherein the controller generates an internal control signal for determining a transfer range of data items located in respective registers included in the filter by combining at least one of a plurality of delay signals with each other.

12. The FIR filter of claim 1, wherein the controller generates an internal control signal for determining whether data items located in respective registers included in the filter sequentially transfer to next register or data items of respective register transfer by skipping the next register.

13. The FIR filter of claim 1, wherein the controller generates an internal control signal for determining the number of output data items of the filter by combining at least one of the plurality of delay signals with each other.

14. The FIR filter of claim 1, wherein the controller generates an internal control signal for determining the number of input data items to the filter and a time period where respective input data items are received by combining at least one of a plurality of delay signals with each other.

15. The FIR filter of claim 1, wherein the controller generates an internal control signal for determining a range of a register to be used for an operation with predetermined weights (filter coefficients) among registers included in the filter by combining at least one of a plurality of delay signals.

* * * * *